US 6,734,665 B2

(12) United States Patent
Jagiella et al.

(10) Patent No.: US 6,734,665 B2
(45) Date of Patent: May 11, 2004

(54) INDUCTIVE SENSOR HAVING A SENSOR COIL IN THE FORM OF A STRUCTURED CONDUCTIVE LAYER

(75) Inventors: Manfred Jagiella, Notzingen (DE); Norbert Schröder, Esslingen (DE); Carsten Elschner, Schlat (DE)

(73) Assignee: Balluff GmbH, Neuhausen (DE)

( * ) Notice: Subject to any disclaimer, the term of this patent is extended or adjusted under 35 U.S.C. 154(b) by 0 days.

(21) Appl. No.: 09/963,833

(22) Filed: Sep. 25, 2001

(65) Prior Publication Data

US 2002/0039023 A1 Apr. 4, 2002

(30) Foreign Application Priority Data

Sep. 29, 2000 (DE) .......................... 100 48 290

(51) Int. Cl.⁷ ..................... G01B 7/00; H05K 13/04
(52) U.S. Cl. ................. 324/207.16; 324/234; 361/760
(58) Field of Search ............ 324/207.26, 207.16, 324/207.15, 303.24, 234, 236, 237, 260, 256, 257, 258, 254; 336/200, 232; 361/760; 343/702

(56) References Cited

U.S. PATENT DOCUMENTS

| 3,444,460 | A | * | 5/1969 | Penney, Jr. .................. 324/260 |
| 4,441,602 | A | | 4/1984 | Ostroski et al. |
| 4,571,595 | A | * | 2/1986 | Phillips et al. .............. 343/702 |
| 5,411,126 | A | | 5/1995 | Seitz |
| 5,575,057 | A | | 11/1996 | Seitz |
| 5,863,445 | A | * | 1/1999 | Geisel et al. ................ 324/326 |
| 6,087,743 | A | * | 7/2000 | Guckel et al. .............. 324/236 |

| 6,115,261 | A | 9/2000 | Platt et al. |
| 6,332,359 | B1 | 12/2001 | Ueyanagi et al. |
| 2002/0007678 | A1 | 1/2002 | Ueyanagi et al. |
| 2002/0007679 | A1 | 1/2002 | Ueyanagi et al. |
| 2002/0011110 | A1 | 1/2002 | Ueyanagi et al. |
| 2002/0017137 | A1 | 2/2002 | Ueyanagi et al. |
| 2002/0017138 | A1 | 2/2002 | Ueyanagi et al. |

FOREIGN PATENT DOCUMENTS

| DE | 43 14 296 | 11/1994 |
| DE | 44 32 468 | 10/1995 |
| DE | 198 05 750 | 8/1999 |
| DE | 199 03 585 | 8/1999 |
| EP | 0 572 847 | 12/1993 |
| EP | 0 992 777 | 4/2000 |

OTHER PUBLICATIONS

Popovic, R.S., et al., "The future of magnetic sensors," Sensors and Actuators A 56 (1996) pp. 39–55.
Passeraub et al., "Inductive proximity sensor with a flat coil and a new differential relation oscillator," Sensors and Actuators A 60 (1997) pp. 122–126.

* cited by examiner

*Primary Examiner*—Walter E. Snow
(74) *Attorney, Agent, or Firm*—Barry R. Lipsitz; Douglas M. McAllister (57) ABSTRACT

In order to so improve an inductive sensor comprising at least one sensor coil in the form of a structured, conductive layer of a carrier board, and an evaluation circuit comprising a printed circuit board with conductor tracks provided thereon and being connected to the sensor coil, that it is manufacturable as cost-efficiently as possible, it is proposed that the carrier board carrying the sensor coil be mechanically rigidly and electrically connected to the printed circuit board by at least two soldered joints.

24 Claims, 10 Drawing Sheets

INDUCTIVE SENSOR HAVING A SENSOR COIL IN THE FORM OF A STRUCTURED CONDUCTIVE LAYER

The present disclosure relates to the subject matter disclosed is German application No. 100 48 290.2 Sep. 29, 2000, which is incorporated herein by reference in its entirety and for all purposes.

BACKGROUND OF THE INVENTION

The invention relates to an inductive sensor comprising at least one sensor coil in the form of a structured conductive layer of a carrier board, and an evaluation circuit which comprises a printed circuit board with conductor tracks provided thereon and is connected to the sensor coil.

Such inductive sensors are known from the prior art.

Herein the sensor coil is a separate component provided with flexible lines, and these lines have then to be connected to the printed circuit board of the evaluation circuit. To assemble the sensor coil and the evaluation circuit in a housing, the sensor coil and the evaluation circuit are placed separately by themselves or are introduced as a precast unit into the housing.

The object underlying the invention is, therefore, to so improve an inductive sensor of the generic kind that it is manufacturable in as cost-efficient a way as possible.

SUMMARY OF THE INVENTION

This object is accomplished with an inductive sensor of the kind described at the outset, in accordance with the invention, in that the carrier board carrying the sensor coil is mechanically rigidly and electrically connected to the printed circuit board by at least two soldered joints.

The advantage of the inventive solution is to be seen in the fact that two soldered joints are adequate to not only connect the sensor coil electrically to the printed circuit board, but to also simultaneously establish a mechanical connection between sensor coil and printed circuit board, so that the sensor coil and the printed circuit board form a unit for joint handling and insertion in the course of the further manufacturing process into the housing.

Such a solution offers considerable cost advantages for the manufacture, as there is no longer any need for flexible lines to be individually handled and soldered or for sensor coil and printed circuit board to be mechanically positioned, but instead an electrical connection can also be made simultaneously by two mechanically rigid soldered joints.

One type of design of the connection of carrier board and printed circuit board provides for one of the soldered joints to comprise a solder finger protruding from one of the boards and a solder surface arranged on the other board, with solder finger and solder surface being joined by a conventional solder aggregation.

It is even more advantageous for both soldered joints to comprise a solder finger protruding from one of the boards and a solder surface provided on the other board.

The advantage of providing a solder finger on one of the boards is that a solder finger can usually be arranged in a simple way, for example, by pressing it into one of the boards, and can also be easily brought into electrical contact with an electrically conductive layer of the board by this pressing-in.

Moreover, such a solder finger is rigid in itself, and this thus also results in a simple way in the inventive mechanically rigid soldered joint between the carrier board and the printed circuit board.

Such a solder finger can, for example, be in the form of a pin. It is, however, also conceivable for this solder finger to be in the form of a piece of flat material.

As an alternative to provision of solder fingers for the soldered joints, a further advantageous embodiment makes provision for one of the soldered joints to comprise two solder surfaces connected to each other by solder, one of which is arranged on one of the boards. This solution is particularly simple to implement as the solder surfaces can be created in a simple way by electrically conductive layers provided on the respective board, and thus merely the solder, for example, in the form of a solder aggregation, mechanically rigidly connects a solder surface on the printed circuit board with a solder surface of the carrier board.

It is thus possible to arrange the carrier board and the printed circuit board spatially in the desired orientation relative to each other and merely by applying a solder aggregation, thereby wetting the solder surfaces, to obtain a mechanically rigid connection between the carrier board and the printed circuit board after hardening of the solder aggregation.

It is particularly advantageous for each of the at least two soldered joints to comprise two solder surfaces connected to each other by solder, one of which is arranged on one of the boards.

The rigid connection is preferably achieved in a simple way by a single soldering operation, for example, by means of a solder bath, into which the carrier board and the printed circuit board dip in the desired orientation relative to each other, whereby both solder surfaces are automatically wetted, and the solder aggregation holding between the two on account of the wetting ensures the mechanically rigid connection between the carrier board and the printed circuit board after cooling of the solder aggregation.

A solder aggregation connecting the solder surfaces is achievable in a particularly reliable way by arranging the boards relative to each other in such a way that the solder surfaces essentially border on one another.

The solder surfaces are preferably arranged such that one of the solder surfaces extends transversely to the other solder surface, so that the desired solder aggregation can form in a simple way between these by wetting of the two solder surfaces.

The fact that the solder surfaces extend transversely to each other includes all acute angles up to a right angle.

It is particularly expedient for the solder surfaces to extend at an approximate right angle to each other, as a particularly advantageous arrangement of the carrier board in relation to the printed circuit board is thereby achievable for conventional housing shapes, and, in addition, owing to the right angle a sufficiently stable joining of the two solder surfaces by the solder aggregation joined to these and a sufficiently large volume of the solder aggregation owing to formation of a type of meniscus between these two solder surfaces are achievable.

No further details of the arrangement of the soldered joints relative to the boards were given in the above explanation of the individual embodiments.

It is, for example, possible for one of the soldered joints to be arranged on one side of the boards and the other soldered joint on the opposite side of the board.

As an alternative to this, it is possible for the at least two soldered joints to be arranged on one side of the respective board, so that the at least two soldered joints can be made in a particularly simple way by the application of solder.

In order to improve the quality of the mechanical joint, in particular, in view of tensions occurring upon cooling of the solder, provision is preferably made for there to be associated with at least one soldered joint arranged on one side of the respective board a corresponding soldered joint on an opposite side of the board.

This solution has the advantage that a soldered joint has associated therewith a corresponding soldered joint on the opposite side of the board, so the forces occurring upon cooling of the solder can thus be compensated in a simple way, and, in addition, it is possible to make the mechanical joint more stable and the electrical connection more fail-safe.

Further details of the arrangement of the printed circuit board and the carrier board relative to each other were not given in connection with the preceding embodiments. It is, for example, conceivable to arrange printed circuit board and carrier board relative to each other with a space between them.

It is, however, particularly expedient for the printed circuit board and the carrier board to abut on one another, as a particularly stable mechanical joint can thus be made between the two, in particular, by the printed circuit board and the carrier board supporting one another owing to their abutment on one another.

To obtain advantageous geometrical conditions, provision is expediently made for the printed circuit board and the carrier board to extend transversely to each other in an area of contact.

It is particularly expedient for the printed circuit board and the carrier board to extend approximately perpendicularly to each other in the area of contact.

An arrangement of printed circuit board and carrier board relative to each other, which is expedient for the design of the sensor, makes provision for the printed circuit board to be arranged close to a plane of symmetry of the carrier board extending perpendicularly to the carrier board.

No further details of the design of printed circuit board and carrier board were given in the above explanation of the individual embodiments. In principle, the boards could be of curved design.

For reasons of simplification, it is particularly expedient for the printed circuit board to be designed as a substantially flat board.

Moreover, it is likewise expedient for the carrier board to also be designed as a substantially flat board.

No further details of the type of the evaluation circuits were given in connection with the embodiments explained above. It is, for example, conceivable to use simple evaluation circuits which operate without an additional inductor, namely only with the sensor coil.

To increase the sensitivity and, in particular, to be able to compensate the temperature dependence of the coils, it is particularly expedient for the evaluation circuit to comprise at least one reference coil as better results are achieved with such evaluation circuits.

In principle, such a reference coil could be of conventional design and connected, for example, via flexible lines to the evaluation circuit.

However, a particularly expedient solution makes provision for the reference coil to be formed by a structured, electrically conductive layer of the printed circuit board, so that the reference coil can also be manufactured when the printed circuit board is being manufactured.

A particularly expedient embodiment does, however, make provision for the reference coil to be integrated in the form of conductor tracks in the printed circuit board. This solution has the advantage that a complicated wiring of the reference coil to the evaluation circuit is no longer necessary since the reference coil is also operatively connected to the evaluation circuit merely by the equipping of the printed circuit board.

This is realizable in different embodiments. One embodiment makes provision for the printed circuit board to be provided with a reference coil arranged in the form of a structured layer on the printed circuit board. This solution is the simplest solution and enables mounting of the reference coil in the same way as the component connections on the printed circuit board.

Moreover, such a reference coil arranged as layer on the printed circuit board also has the advantage that it can be tuned, for example, by layer ablation, for example, by the layer being ablated by means of a laser.

Another advantageous embodiment makes provision for the reference coil to be integrated into an intermediate layer between an upper and a lower layer of the printed circuit board. Such an integration of the reference coil into an intermediate layer makes it possible to construct the printed circuit board with a smaller size, as the space required by the sensor coil is eliminated when it is integrated in an intermediate layer between the upper and lower layers of the printed circuit board, which, for example, can both be equipped with components.

A further embodiment of the evaluation circuit makes provision for a multilayer reference coil.

The sensor coil can be designed in very different ways. It is conceivable to arrange the sensor coil on a front side or a rear side of the carrier board or as intermediate layer of the carrier board, so that the sensor coil is protected by the layers lying on either side of the intermediate layer. It is, however, also conceivable for the sensor coil to be of multilayer design.

No further details of the arrangement and design of the sensor coil were given in the above explanation of the individual embodiments. It is, for example, conceivable for the sensor coil to likewise be provided with a ferrite element arranged on the carrier board.

It is also conceivable to arrange a screening element on the carrier board.

An embodiment of the inventive sensor is particularly expedient when the sensor coil is surrounded by a screening provided in the form of a structured layer on the carrier board.

Such a screening can, for example, be designed in the simplest case as a short-circuited winding enclosing the sensor coil azimuthally.

However, more complicated shapes of a screening in the form of a layer applied to the carrier board, which are adapted to the individual applications, are also realizable.

Another advantageous embodiment, in particular, an embodiment wherein the characteristics of the sensor coil are to be adaptable makes provision for a damping element for the sensor coil, comprising a structured, electrically conductive layer on the carrier board, to be arranged on the carrier board.

Such a solution has the great advantage that with such a damping element the characteristics of the sensor coil can also be adapted in a simple way by tuning to special conditions.

Such a damping element can be implemented in a particularly expedient way when it comprises an electrical resistor which is arranged on the carrier board and is, for example, also tunable in order to be able to vary the damping by the damping element.

Furthermore, in order to have as low a space requirement as possible, a particularly expedient solution makes provision for the carrier board to be provided with electrical components in addition to the sensor coil. Such electrical components could, for example, in the case of inductive sensors, be a capacitor which is associated with the sensor coil for formation of an oscillating circuit.

Such additional electronic components could be arranged on the front side of the carrier board. It is, however, particularly expedient for these to be arranged on a rear side of the carrier board facing away from the sensor coil, as the sensor coil can thus be arranged as closely as possible to a housing side.

Further features and advantages of the inventive solution are the subject of the following description and the appended drawings of several embodiments.

DETAILED DESCRIPTION OF THE INVENTION

Figure 1:
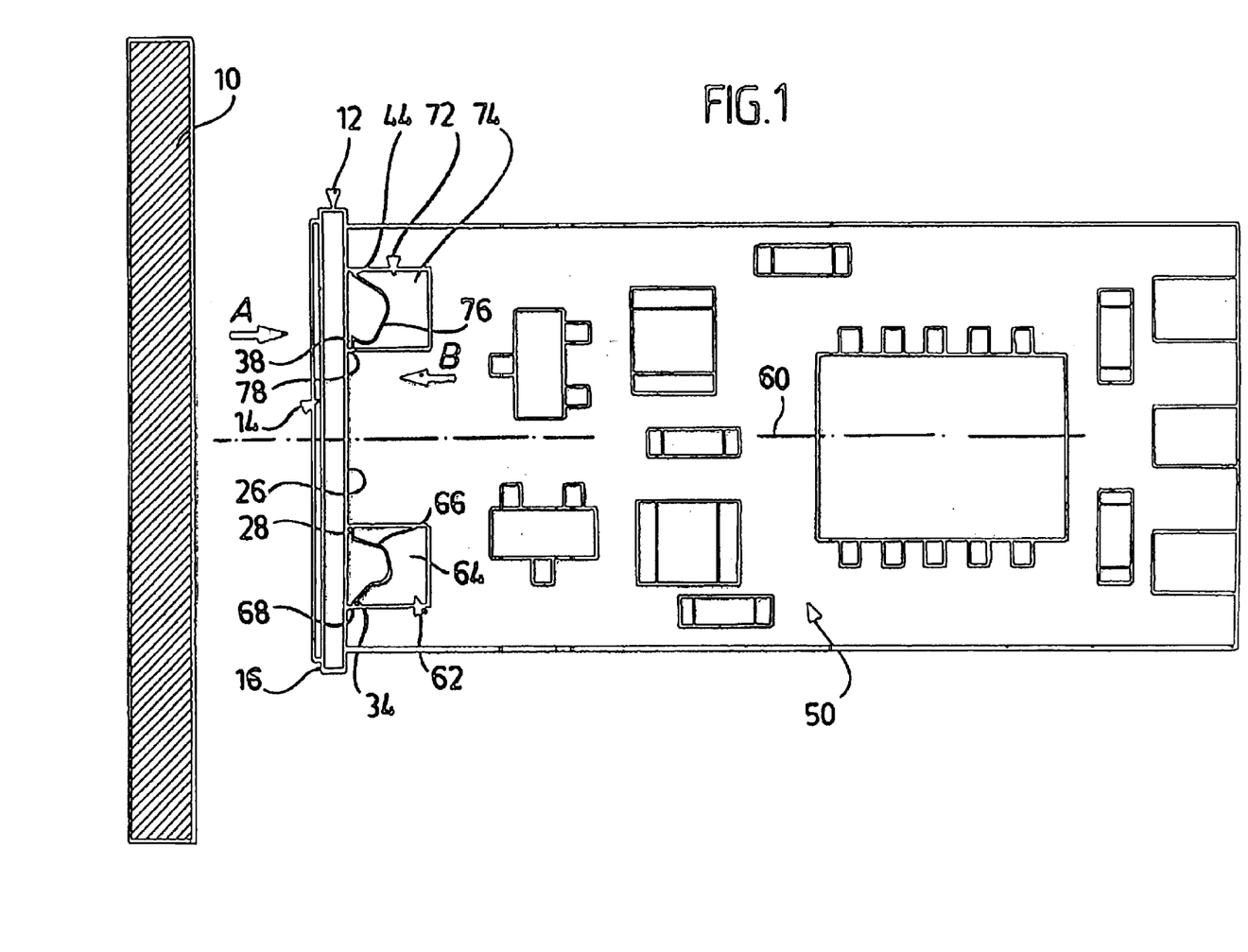
FIG. 1 is a schematic plan view of a first embodiment of an inventive sensor.
Figure 2:
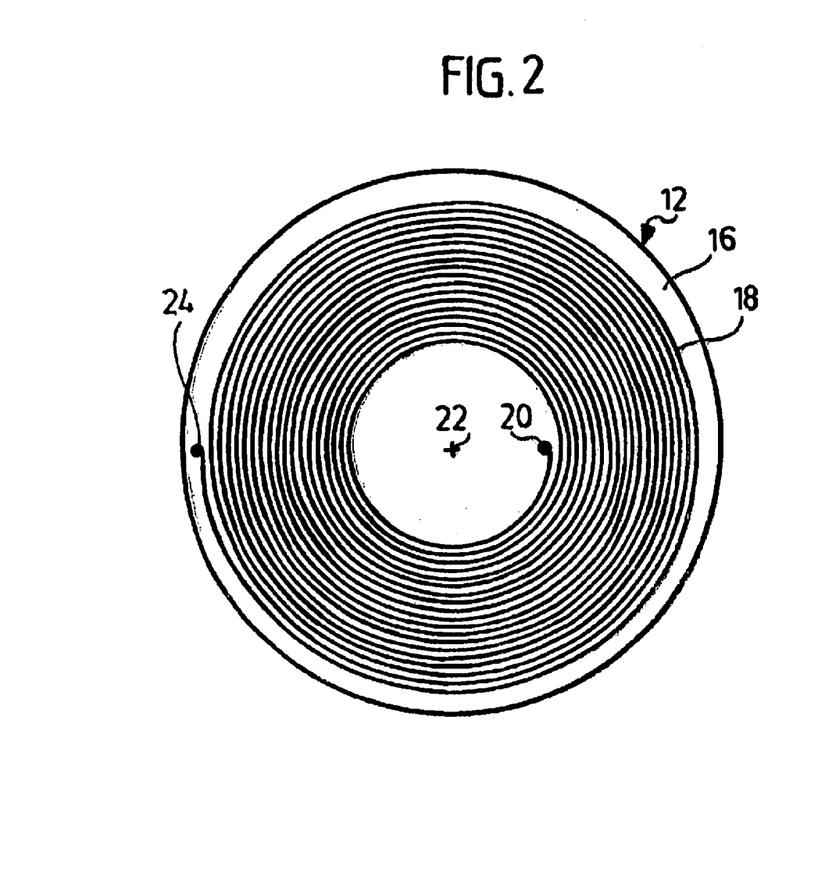
FIG. 2 is a view in the direction of arrow A in FIG. 1.

A first embodiment of an inventive inductive sensor, shown in FIG. 1, which operates, for example, as a proximity switch for recognizing an approaching object 10, comprises a carrier board 12, on which a sensor coil generally designated 14 is arranged, which, as shown in FIG. 2, is in the form of a structured, spiral-shaped layer 18 arranged on a front side 16 of the carrier board so as to expand in the shape of a spiral from an inner terminal 20 in relation to a center point 22 and terminate in an outer terminal 24.

The individual windings of the layer 18 extending in the shape of a spiral from the inner terminal 20 to the outer terminal 24 preferably have approximately the same width radially in relation to the center point 22 and approximately the same spacing from one another radially in relation to the center point 22.

Figure 3:
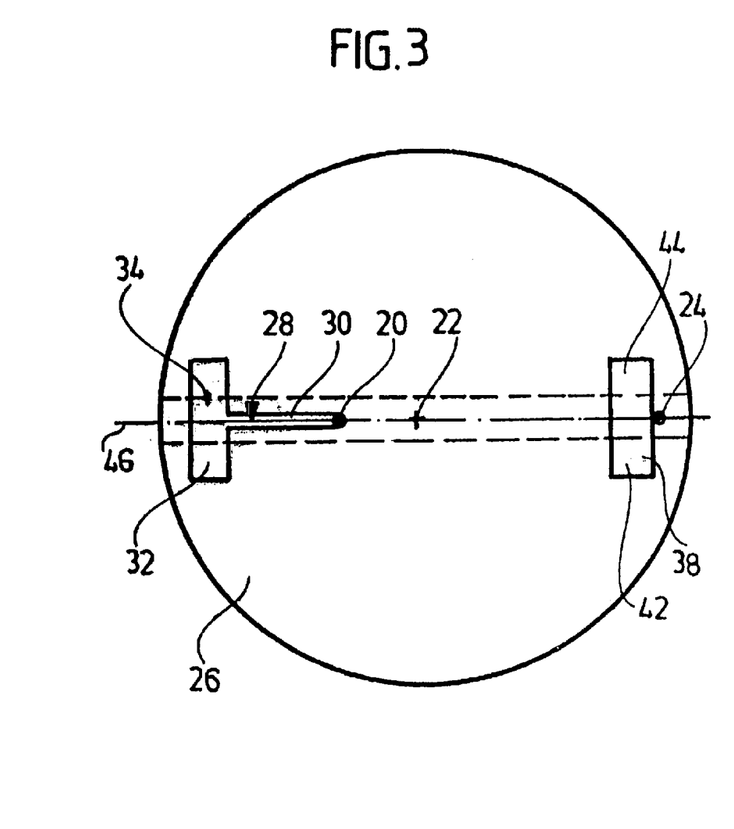
FIG. 3 is a view of a carrier board of the first embodiment in the direction of arrow B in FIG. 1.

The inner terminal 20 is connected through the carrier board 12 to a first contact layer 28 arranged on a rear side 26 of the carrier board 12. The contact layer 28 comprises a conductor track 30 extending radially in relation to the center point 22 and outwardly from the inner terminal 20, and a first contacting area 32 forming a first solder surface 34.

The outer terminal 24 is likewise led through the carrier board 12 and directly connected to a second contact layer 38 which is provided on the rear side 26 and forms with a second contacting area 42 a second solder surface 44.

As shown in FIG. 3, the contacting areas 32 and 42 preferably extend with the solder surfaces 34 and 44 symmetrically to a plane of symmetry 46 of the carrier board 12 extending through the center point 22 and oriented perpendicularly to the front side 16 and the rear side 26.

Figure 4:
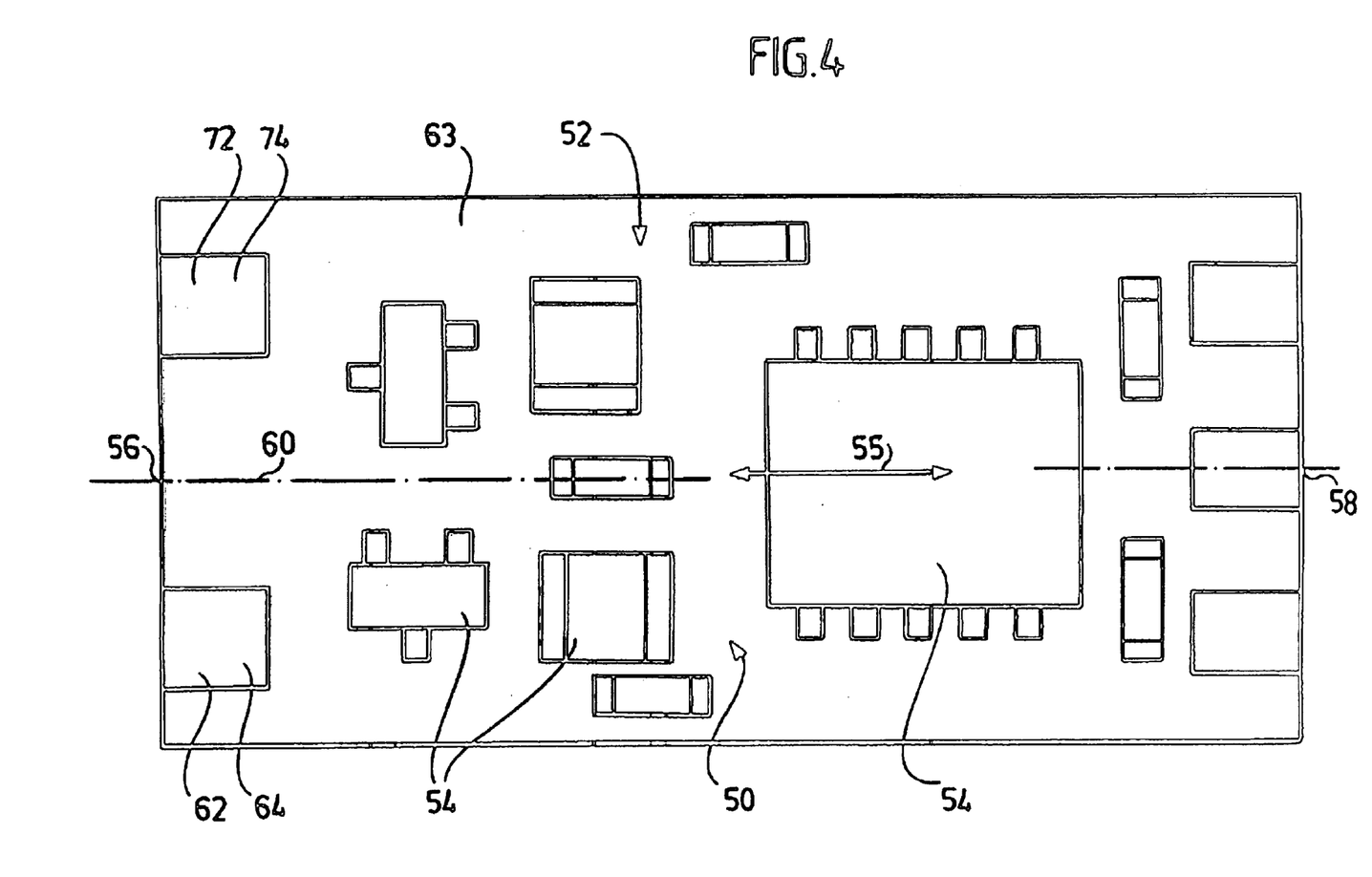
FIG. 4 is a plan view corresponding to FIG. 1 of a printed circuit board of the first embodiment.

As shown in FIGS. 1 and 4, the inductive sensor further comprises an evaluation circuit generally designated 50, which comprises electronic components 54 such as resistors, capacitors and semiconductor components which are arranged on a printed circuit board 52 and are connected to one another to realize the desired switching functions by conductor tracks of the printed circuit board 52 which are not shown in the drawings.

The printed circuit board 52 preferably extends in a longitudinal direction 55 and has a front edge 56 facing the carrier board 12 and a rear side edge 58 opposite the front edge 56.

Immediately adjacent to the front edge 56, contact layers 62 and 72 are arranged on an upper side 63 of the printed circuit board 52 symmetrically in relation to a center axis 60 of the printed circuit board 52 extending parallel to the longitudinal direction 55, and the contact layers 62, 72 form solder surfaces 64 and 74.

The contact layers 62 and 72 are arranged in such a way that when the carrier board 12 lies with its rear side 26 against the front edge 56, the first solder surface 34 and the second solder surface 44 of the contact layers 28 and 38 lie on the rear side 26 at the same distance from the center axis 60. Solder applied to the solder surfaces 34 and 64 and to 44 and 74, which extend at an angle to each other, forms solder aggregations 66 and 76, respectively, which are adhesively joined to the solder surfaces 34 and 64 and to 44 and 74.

This results in soldered joints 68 and 78, comprising the corresponding solder surfaces 64, 34 and 74, 44 with the solder aggregations 66 and 76 effective between these. These produce both an electrical connection between the carrier board 12 for the sensor coil 14 and the printed circuit board 52 for the evaluation circuit 50 and a rigid mechanical connection between the carrier board 12 and the printed circuit board 52.

This solution has the advantage that a separate mechanical connection does not need to be created between the carrier board 12 and the printed circuit board 52, because the soldered joints 68 and 78 simultaneously create in addition to the electrical connection of the sensor coil 14 to the evaluation circuit 50 the rigid mechanical connection of the carrier board 12 to the printed circuit board 52.

In the first embodiment, the soldered joint 68 and 78 is created by only one solder aggregation 66 and 76, respectively, arranged on one side of the printed circuit board 52.

Figure 5:
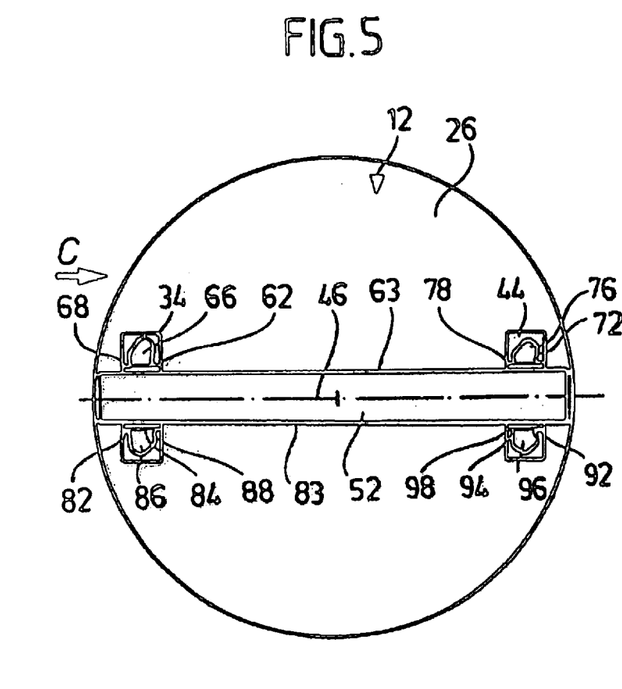
FIG. 5 is a section through a second embodiment taken along line 5—5 in FIG. 6.
Figure 6:
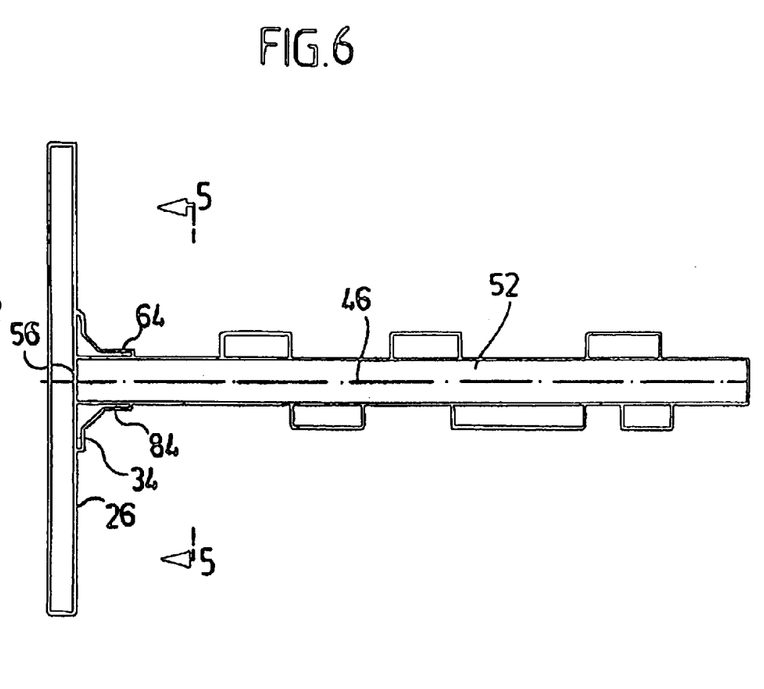
FIG. 6 is a side view of the second embodiment in the direction of arrow C in FIG. 5.

In a second embodiment, shown in FIG. 5 and FIG. 6, the printed circuit board 52 is arranged relative to the carrier board 12 such that its front edge 56 lies against the rear side 26 of the carrier board 12 at the level of the plane of symmetry 46, and the plane of symmetry 46 preferably represents a center plane of the printed circuit board 52, so that the solder surfaces 34 and 44 preferably extend on either side of the plane of symmetry 46 and project over both the upper side 63 and an underside 83 of the printed circuit board 52.

Furthermore, the printed circuit board is provided both on the upper side 63 with the contact layers 62 and 72 and on the underside 83 with contact layers 82 and 92, which likewise have solder surfaces 84 and 94, respectively.

It is thus possible, by means of additional solder aggregations 86 and 96, to also create soldered joints 88 and 98, respectively, which are effective via the underside 83. As supplements to the soldered joints 68 and 78, these ensure improved mechanical stability of the mechanical connection between the carrier board 12 and the printed circuit board 52 and also have the advantage that when the solder aggregations 66 and 76 cool, there are no one-sided pulling forces acting on the connection between the carrier board 12 and the printed circuit board 52, but these pulling forces which occur upon cooling of the solder aggregations 66 and 76 are compensated by corresponding pulling forces of the cooling solder aggregations 86 and 96.

To increase the redundancy, the contact layers 62 and 82 and also 72 and 92 are preferably electrically connected to each other so that even in the event of breakage of one of the two soldered joints 68 or 88 and 78 or 98, respectively, an electrical contact is still maintained between the evaluation circuit 50 and the sensor coil 14.

The inventive solution thus has the advantage that a high mechanical stability and a high electrical reliability of the connection between the carrier board 12 with the sensor coil 14 and the evaluation circuit 50 is achievable owing to the pairs of soldered joints 68, 88 and 78, 98, respectively.

Aside from that, in the second embodiment all those elements which are identical with those of the first embodiment are given the same reference numerals and so reference can be had in full to the statements on the first embodiment for a description of these.

Figure 7:
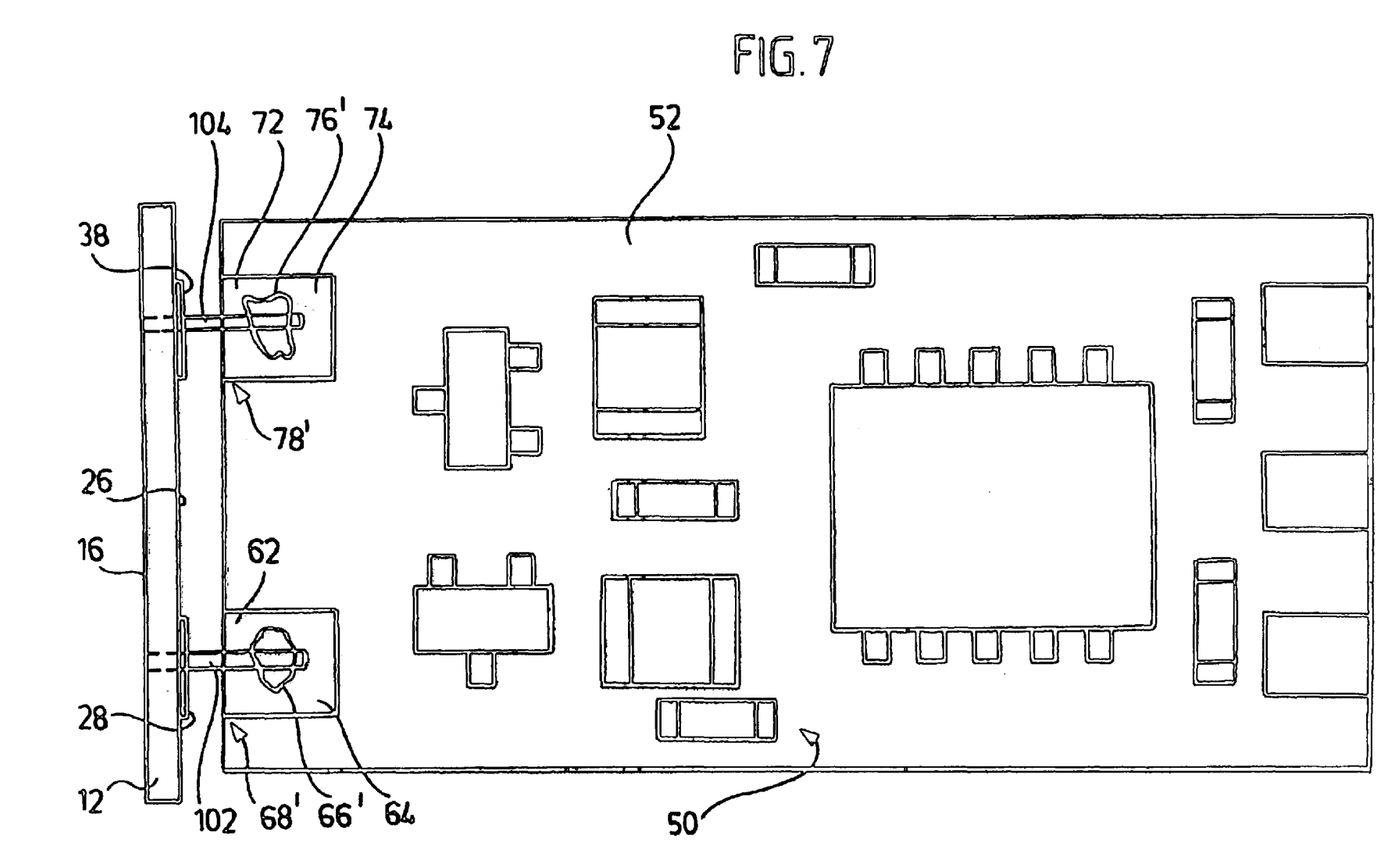
FIG. 7 is a view similar to FIG. 1 of a third embodiment.

In a third embodiment, shown in FIG. 7, the first contact layer 28 and the second contact layer 38 are not provided with solder surfaces, but with pressed-through contact pins 102 and 104 whose spacing is selected such that these are fixable on the solder surfaces 64 and 74 of the printed circuit board 52 with a solder aggregation 66' and 76', respectively.

In contrast to the first and second embodiments, the soldered joints 68' and 78' thus comprise the contact layers 28 and 38, and the contact pins 102 and 104, and also the solder aggregations 66' and 76' and the contact layers 62 and 72.

Aside from that, however, the advantages are the same as in the first and second embodiments.

Moreover, in a variant of the third embodiment the contact pins 102 and 104 can also be replaced by flat contact plates.

Aside from that, those parts which are identical to those of the first and second embodiments are given the same reference numerals and so reference is to be had in full to the statements on these embodiments for a description of these.

Figure 8:
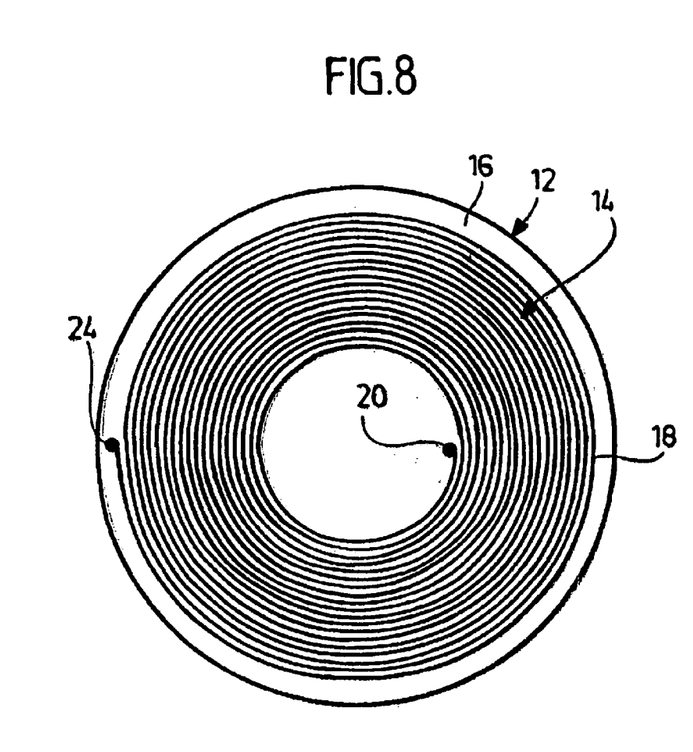
FIG. 8 is a view similar to FIG. 2 of a fourth embodiment.
Figure 9:
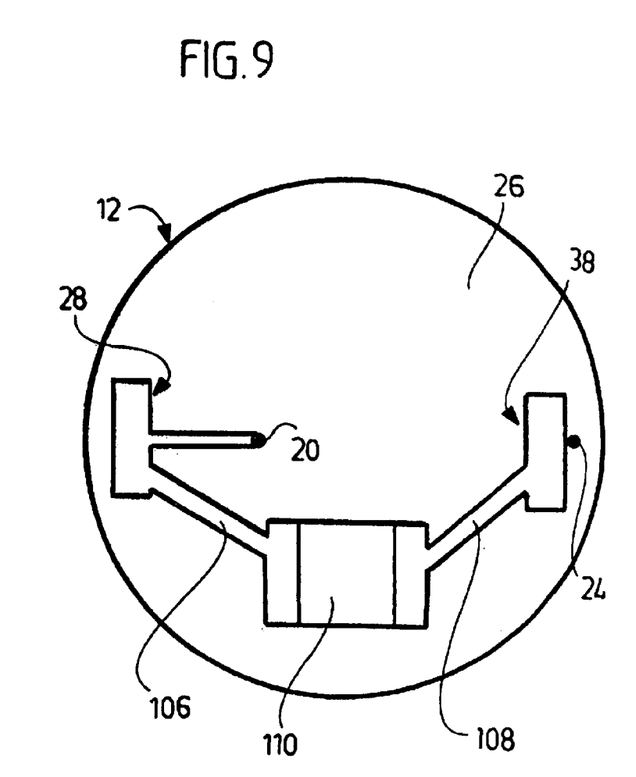
FIG. 9 is a view similar to FIG. 3 of the fourth embodiment.

In a fourth embodiment, shown in FIG. 8 and FIG. 9, the carrier board 12 is provided in the same way as in all other embodiments on its front side with the sensor coil 14 in the form of the layer 18 extending in the shape of a spiral from the inner terminal 20 to the outer terminal 24.

In contrast to the preceding embodiments, the carrier board 12 carries on its rear side 26 not only the contact layers 28 and 38 but two additional conductor tracks 106 and 108, which lead to a component 110, for example, a vibrating capacitor, which is associated with the sensor coil 14 in order, for example, to form an LC oscillating circuit which is connected to the evaluation circuit 50 in the same way as described in the preceding embodiments.

The advantage of this solution is to be seen in the fact that owing to the additional component 110, for example, the capacitor of the LC oscillating circuit, a spatial arrangement of the sensor coil 14 and the capacitor 110 is created, which owing to its compact arrangement exhibits a low susceptibility to interference, and, in addition, creates additional space on the printed circuit board 52 in order to be able to accommodate more components of the evaluation circuit 50 on the printed circuit board 52 or to be able to make the printed circuit board 52 smaller.

Aside from that, in the fourth embodiment according to FIG. 8 and FIG. 9 the evaluation circuit 50 and the printed circuit board 52 are designed in the same way as in the preceding embodiments so that reference can be had in full to the statements thereon and descriptions thereof.

Figure 10:
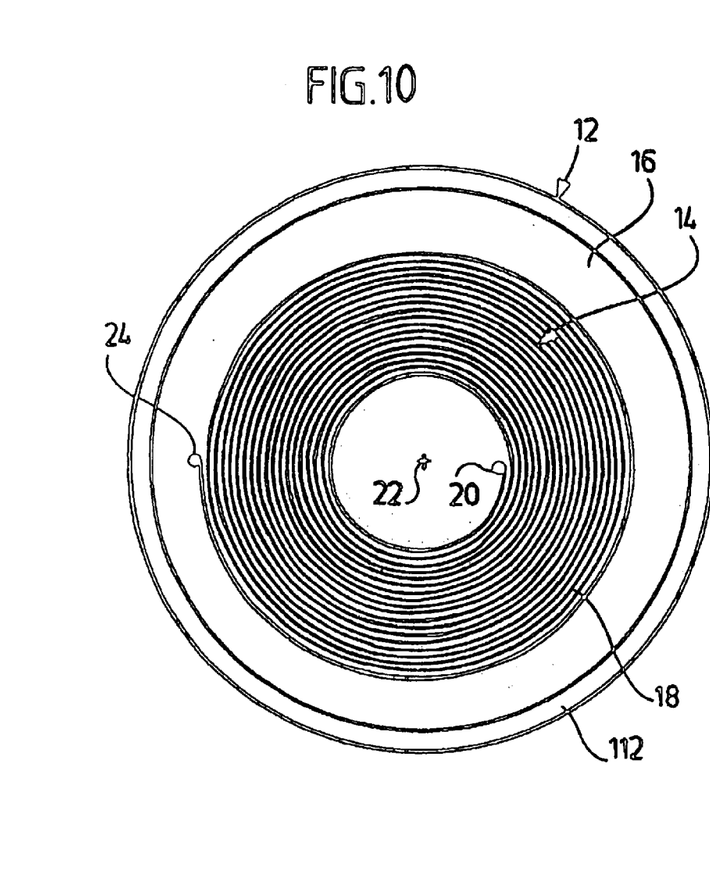
FIG. 10 is a view similar to FIG. 2 of a fifth embodiment.

In a fifth embodiment, shown in FIG. 10, in contrast to the preceding embodiments there is arranged on the front side 16 of the carrier board 12 not only the sensor coil 14 with the layer 18 extending in the form of a spiral from the inner terminal 20 to the outer terminal 24, but, in addition, an electrically conductive layer 112, which surrounds the sensor coil 14, thereby lying radially outwardly in relation to the center point 22, and is closed in azimuthal direction, so that a so-called short-circuited winding or screening winding results, which is advantageous for installation of the sensor in a metallic environment.

Figure 11:
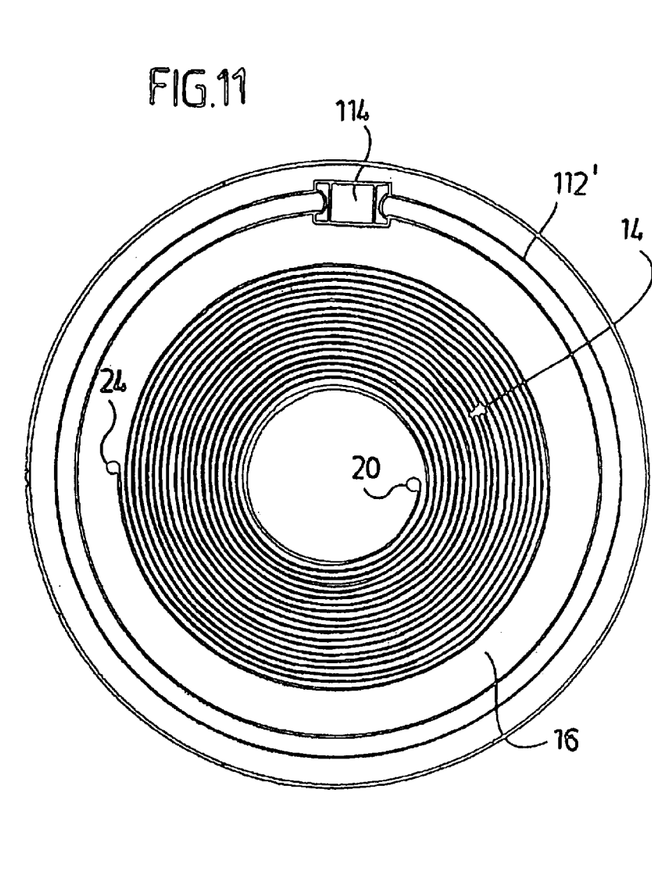
FIG. 11 is a view similar to FIG. 2 of a sixth embodiment.

As an alternative thereto, in a sixth embodiment, shown in FIG. 11, the outer layer 112' is interrupted in azimuthal direction and joined by a component 114, for example, an electric resistor, so that this outer layer 112' is usable as a short-circuited winding for damping the sensor coil, the damping being achievable by adjustment of the resistor 114.

With this solution it is, for example, also possible to subsequently tune the resistor 14, for example, by means of a laser.

Aside from that, the fifth and sixth embodiments are designed in the same way as in one of the preceding embodiments, so that those parts which are identical to those of the preceding embodiments are given the same reference numerals and reference is to be had in full to the statements on these embodiments.

Figure 12:
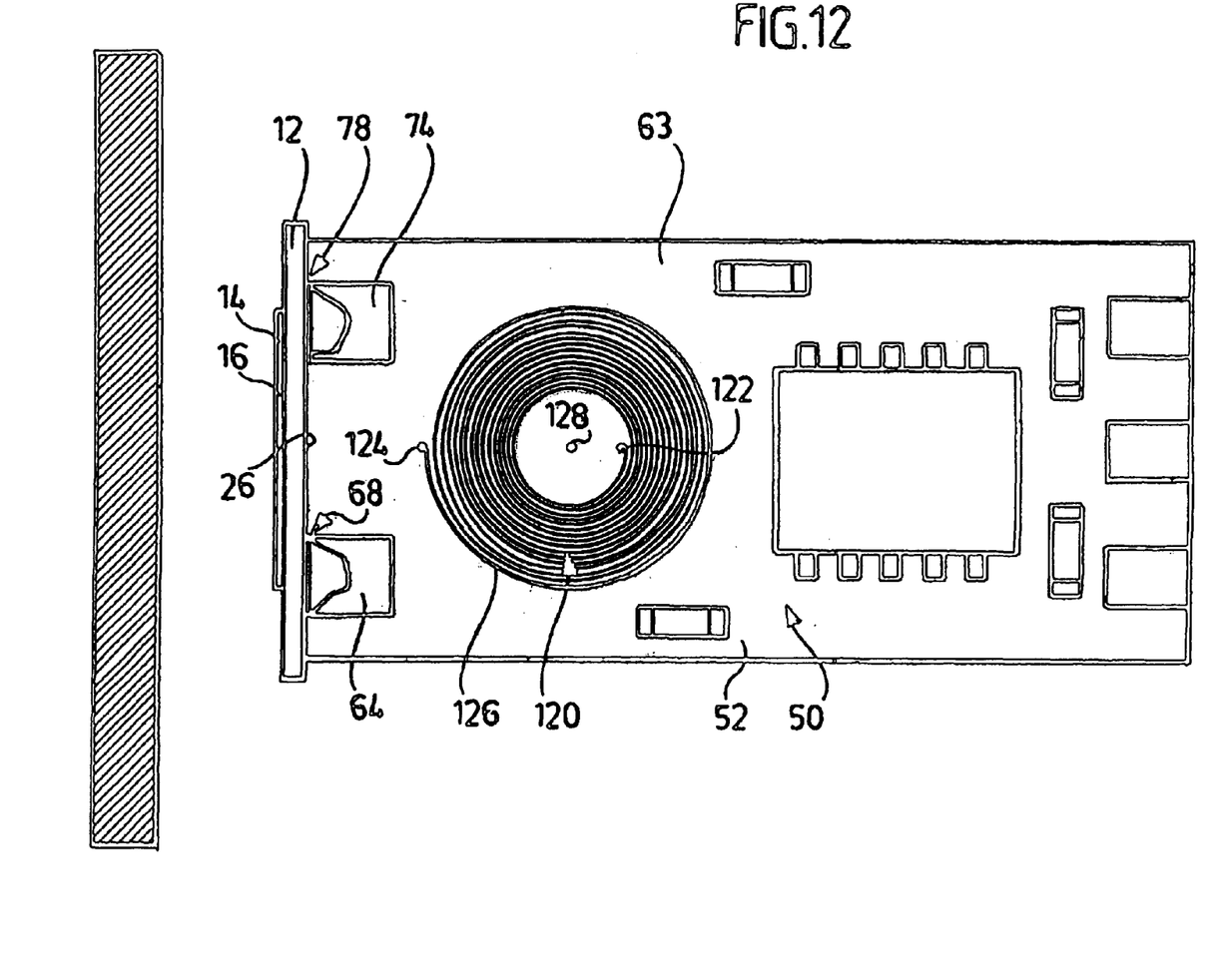
FIG. 12 is a view similar to FIG. 1 of a seventh embodiment.

In a seventh embodiment, shown in FIG. 12, the carrier board 12 with the sensor coil 14 is designed, for example, in the same way as explained in connection with the first embodiment.

The soldered joints 68 and 78 are also designed as explained in connection with the first embodiment.

In contrast to the preceding embodiments, in the seventh embodiment the evaluation circuit 50 itself is provided with a reference coil 120, which is formed, for example, on the upper side 63 of the printed circuit board 52 as a layer 126 extending in the form of a spiral from an inner terminal 122 to an outer terminal 124, the width of individual windings of the layer 126 extending radially in relation to a center point 128 and the spacing of these windings 126 in the radial direction in relation to the center point 128 being essentially approximately equal in size.

The advantage of this seventh embodiment is thus to be seen in the fact that the reference coil 120 required for the increase in the sensitivity of inductive sensors can be manufactured in a simple way and arranged on the printed circuit board 52 without additional manufacturing expenditure being required for connecting the reference coil to the evaluation circuit. When manufacturing the printed circuit board 52, the reference coil 120 can be produced in a simple way together with the conductor tracks of the printed circuit board 52 and electrically connected to these.

Moreover, the provision of the reference coil 120 on the printed circuit board offers a further possibility of improving the sensitivity, namely by the sensor coil 14 and the reference coil 120 being manufacturable in an essentially similar way, i.e., having substantially the same dimensions so that their inductivity is essentially the same.

It is particularly expedient for the carrier board 12 and the printed circuit board 52 to also be made of the same material. The characteristics of the sensor coil 14 and the reference coil 120 can be tuned to each other in an even more advantageous way by these being manufactured in the same manufacturing process so that also the thickness of the spirally extending layers 18 and 126 and their material characteristics as well as their dimensional tolerances in the radial direction in relation to the center point 22 and 128, respectively, are essentially identical.

Aside from that, those parts which are identical to those of the preceding embodiments are given the same reference numerals, so that reference can be had in full to the preceding embodiments for an explanation of these parts.

Figure 13:
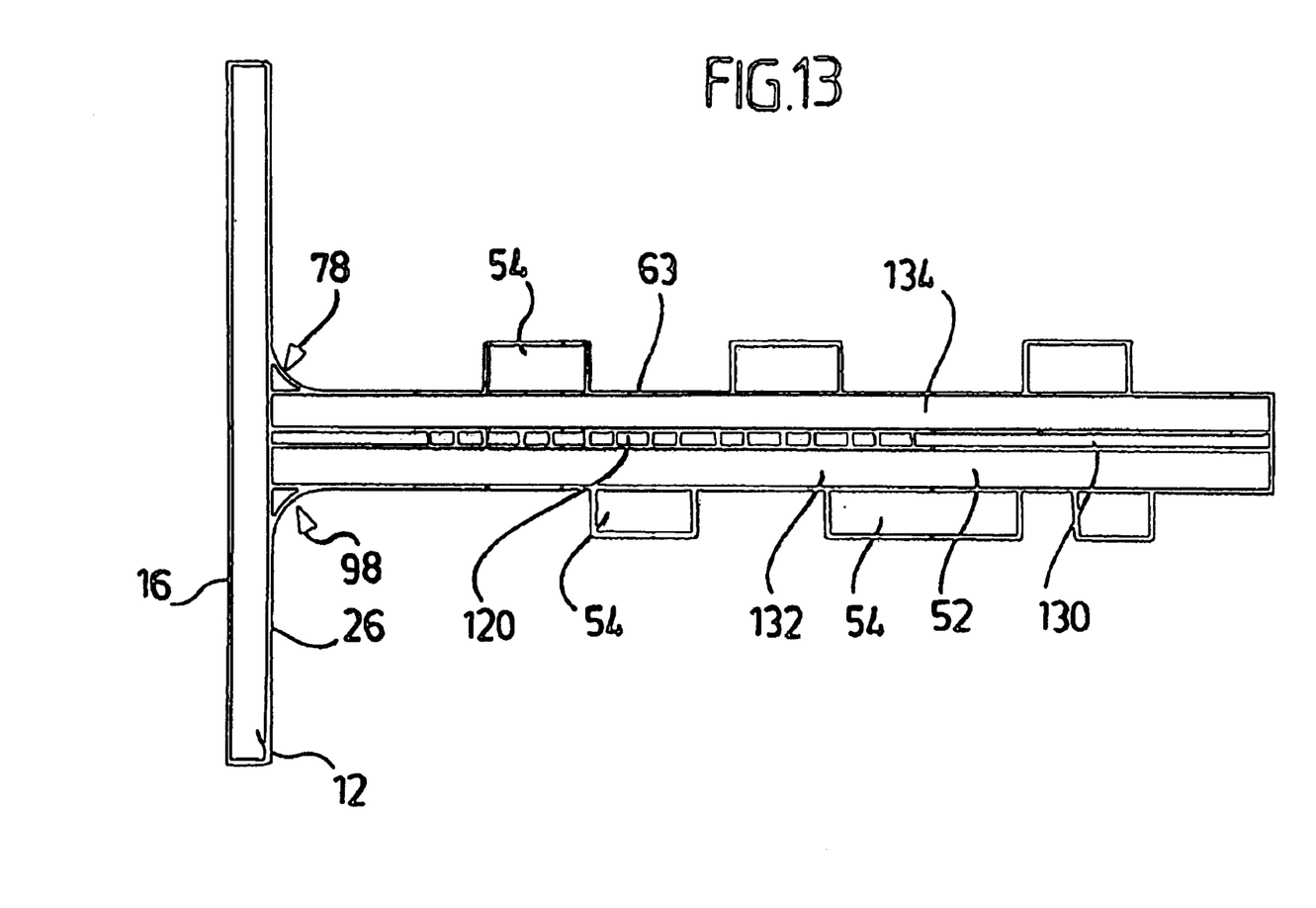
FIG. 13 is a view similar to FIG. 6 of a eighth embodiment.

In an eighth embodiment, shown in FIG. 13, the sensor coil 120 is not arranged on the upper side 63 of the printed circuit board 52, but is integrated into the printed circuit board 52, for example, as center layer 130, between two layers 132 and 134, so that the layers 132 and 134 of the printed circuit board 52 can be provided as upper and lower layers with components 54 on their surface, and the size of the printed circuit board 52 is primarily determined by the number and type of the components 54 arranged on the layers 132 and 134, and not by the reference coil 120.

Aside from that, the eighth embodiment is also given the same reference numerals insofar as the same components are used as in the preceding embodiments, so that reference can be had in full to the statements on the preceding embodiments for a description of these.

Figure 14:
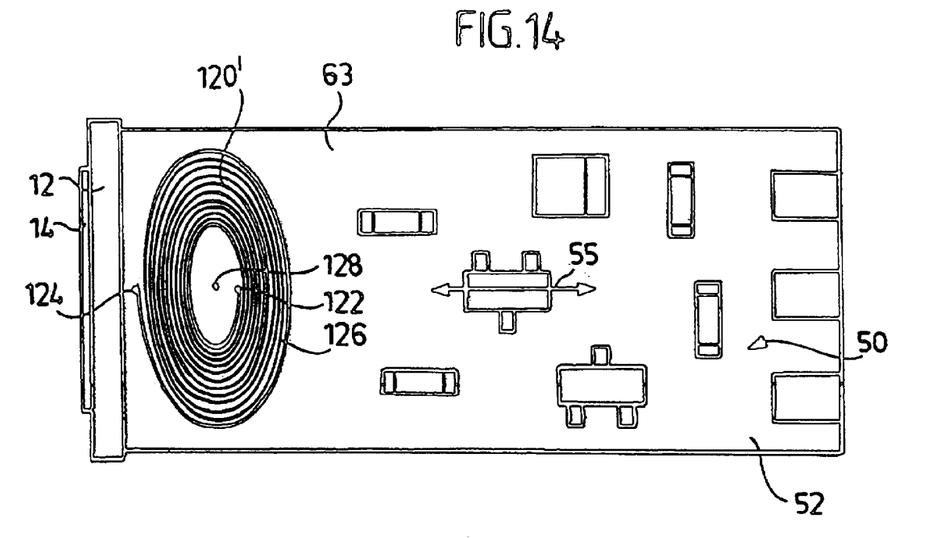
FIG. 14 is a view similar to FIG. 1 of a ninth embodiment.

In a ninth embodiment, shown in FIG. 14, those parts which are identical to those of the preceding embodiments are given the same reference numerals, so that reference can be had in full to the preceding embodiments for a description of these parts.

In contrast to the seventh and eighth embodiments, the reference coil 120' is no longer designed as a coil which is rotationally symmetrical to the center point 128, but the individual windings of the layer 126 extending in the shape of a spiral from the inner end 122 to the outer end 124 are of elliptical design, in order to reduce the extent of the reference coil 120 in the direction of the longitudinal direction 55 of the printed circuit board 52 and, in particular, when the reference coil 120' is arranged on the upper side 63 of the printed circuit board 52, to thus reduce the space requirement for the reference coil 120'.

Figure 15:
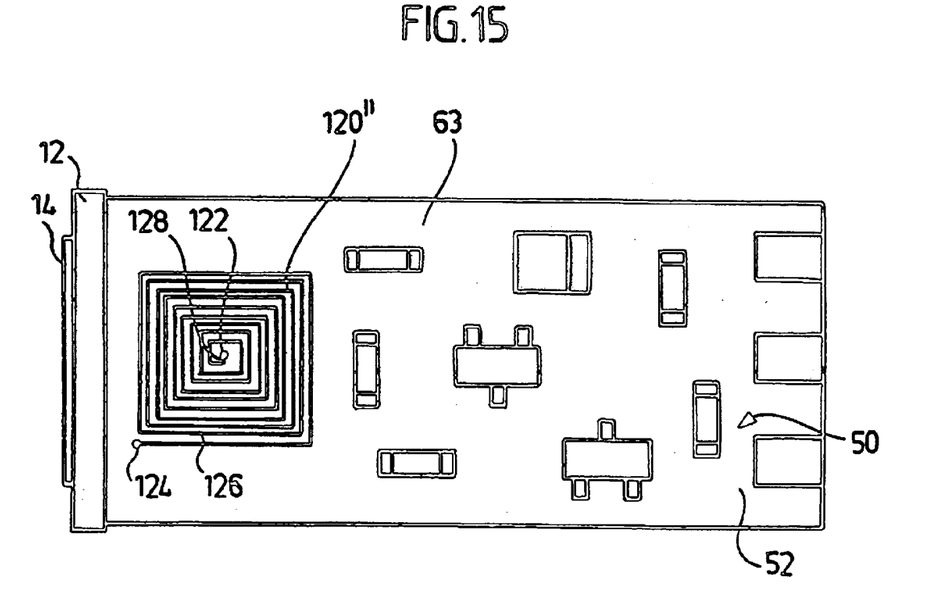
FIG. 15 is a view similar to FIG. 1 of a tenth embodiment.

In a tenth embodiment, shown in FIG. 15, the reference coil 120" is also changed insofar as it does not extend rotationally symmetrically in relation to the center point 128. The inner terminal 122 is arranged such that it coincides with the center point 128, and the individual windings of the layer 128 extend in the form of a rectangular spiral in relation to the center point 128 as far as the outer terminal 124.

This embodiment of the reference coil 120" is also more space-saving than the reference coil 120 and thus enables a reduction in the size of the printed circuit board 52 owing to a reduced space requirement for the reference coil 120".

Aside from that, the ninth and tenth embodiments are designed in the same way as the preceding embodiments, so that reference can be had in full to the statements on the preceding embodiments for details of the other components.

Moreover, in all other embodiments, but, in particular, in the ninth and tenth embodiments, it is possible for the sensor coil 14 to likewise not be designed radially symmetrically, but to be, for example, of elliptical or rectangular design, so as to adapt the sensor coil 14 to the type of design of the reference coil 120', 120".

What is claimed is:

1. Inductive sensor comprising:
   at least one sensor coil in the form of a structured, conductive layer of a carrier board;
   and an evaluation circuit comprising a printed circuit board with conductor tracks provided thereon and being connected to the sensor coil;
   wherein the carrier board carrying the sensor coil is mechanically rigidly and electrically connected to the printed circuit board by at least two soldered joints.

2. Sensor in accordance with claim 1, wherein one of the soldered joints comprises a solder finger protruding from one of the boards, and a solder surface arranged on the other board.

3. Sensor in accordance with claim 2, wherein both soldered joints comprise a solder finger protruding from one of the boards and a solder surface provided on the other board.

4. Sensor in accordance with claim 1, wherein one of the soldered joints comprises two solder surfaces joined to each other by solder, one of which is arranged on one of the boards.

5. Sensor in accordance with claim 4, wherein each of the at least two soldered joints comprises two solder surfaces joined to each other by solder, one of which is arranged on one of the boards.

6. Sensor in accordance with claim 4, wherein the boards are arranged relative to each other in such a way that the solder surfaces essentially border on each other.

7. Sensor in accordance with claim 4, wherein one of the solder surfaces extends transversely to the other solder surface.

8. Sensor in accordance with claim 7, wherein the two solder surfaces extend at an approximate right angle to each other.

9. Sensor in accordance with claim 1, wherein the at least two soldered joints are arranged on one side of the boards.

10. Sensor in accordance with claim 9, wherein at least one soldered joint arranged on one side of the respective board has associated therewith a corresponding soldered joint on an opposite side of the board.

11. Sensor in accordance with claim 1, wherein the printed circuit board and the carrier board abut on one another.

12. Sensor in accordance with claim 11, wherein the printed circuit board and the carrier board extend transversely to each other in an area of contact.

13. Sensor in accordance with claim 1, wherein the printed circuit board is arranged close to a plane of symmetry of the carrier board extending perpendicularly to the carrier board.

14. Sensor in accordance with claim 1, wherein at least one reference coil is associated with the evaluation circuit.

15. Sensor in accordance with claim 14, wherein the reference coil is formed by a structured, electrically conductive layer of the printed circuit board.

16. Sensor in accordance with claim 15, wherein the reference coil is integrated in the form of conductor tracks in the printed circuit board.

17. Sensor in accordance with claim 15, wherein the printed circuit board is provided with a reference coil arranged in the form of a structured, conductive layer on the printed circuit board.

18. Sensor in accordance with claim 15, wherein the reference coil is integrated into an intermediate layer between an upper layer and a lower layer of the printed circuit board.

19. Sensor in accordance with claim 1, wherein the sensor coil is surrounded by a screening provided in the form of a structured layer on the carrier board.

20. Sensor in accordance with claim 19, wherein the screening is in the form of a short-circuited winding.

21. Sensor in accordance with claim 1, wherein a damping element for the sensor coil, comprising a structured, electrically conductive layer on the carrier board, is arranged on the carrier board.

22. Sensor in accordance with claim 21, wherein the damping element comprises an electric resistor.

23. Sensor in accordance with claim 1, wherein the carrier board is additionally provided with an electronic component.

24. Sensor in accordance with claim 23, wherein the carrier board is provided with the electronic component on its rear side facing away from the sensor coil.

* * * * *